United States Patent
Frey et al.

(10) Patent No.: US 10,816,941 B2
(45) Date of Patent: Oct. 27, 2020

(54) ENERGY EFFICIENCY OF A BUILDING AT THE PLANNING STAGE

(71) Applicant: Siemens Schweiz AG, Zurich (CH)

(72) Inventors: Christian Frey, Unteraegeri (CH); Roland Ullmann, Steinen (CH)

(73) Assignee: SIEMENS SCHWEIZ AG, Zurich (CH)

( * ) Notice: Subject to any disclaimer, the term of this patent is extended or adjusted under 35 U.S.C. 154(b) by 251 days.

(21) Appl. No.: 15/992,313

(22) Filed: May 30, 2018

(65) Prior Publication Data

US 2018/0348713 A1 Dec. 6, 2018

(30) Foreign Application Priority Data

May 30, 2017 (DE) .......................... 10 2017 209 084

(51) Int. Cl.
- *G05B 13/04* (2006.01)
- *F24F 11/46* (2018.01)
- *G06F 30/13* (2020.01)
- *G05B 15/02* (2006.01)

(52) U.S. Cl.
CPC ............ *G05B 13/041* (2013.01); *F24F 11/46* (2018.01); *G06F 30/13* (2020.01); *G05B 15/02* (2013.01); *G05B 2219/2642* (2013.01)

(58) Field of Classification Search
CPC .................................................. G05B 13/041
See application file for complete search history.

(56) References Cited

U.S. PATENT DOCUMENTS

| | | | | |
|---|---|---|---|---|
| 2008/0120069 | A1* | 5/2008 | Martin | G06F 30/13 703/1 |
| 2010/0106674 | A1* | 4/2010 | McLean | G06Q 10/06 706/52 |
| 2012/0323382 | A1 | 12/2012 | Kamel et al. | 700/286 |
| 2013/0218349 | A1* | 8/2013 | Coogan | G05B 13/02 700/275 |
| 2013/0338970 | A1* | 12/2013 | Reghetti | G06F 30/13 703/1 |
| 2017/0345208 | A1* | 11/2017 | Ashdown | G06F 30/23 |
| 2018/0189422 | A1* | 7/2018 | Yu | G06F 30/13 |

OTHER PUBLICATIONS

Din, En, 15232-1 Deutsche Norm, "Energieeffizienz von Gebäuden—Teil 1: Einfluss von Gebäudeautomation und Gebäudemanagement—Module M10-4, 5, 6, 7, 8, 9, 10," European Committee for Standardization, pp. 1-212, Jan. 2016.

* cited by examiner

*Primary Examiner* — Nathan L Laughlin
(74) *Attorney, Agent, or Firm* — Slayden Grubert Beard PLLC

(57) ABSTRACT

Various embodiments may include methods and systems for improving the energy efficiency of a building at the planning stage, such as: building a basic digital model of the building using a computer; defining a plurality of different function-related room categories; assigning existing technical building automation functions, previously stored in a memory coupled to the computer, to the different room categories; arranging rooms by assigning the defined categories to the model on the basis of an occupancy plan; coupling the rooms to supply lines of a automation system based on the assigned functions; determining an energy efficiency of the virtual building; and selecting suitable technical system modules from available modules based on the determined energy efficiency.

8 Claims, 2 Drawing Sheets

ENERGY EFFICIENCY OF A BUILDING AT THE PLANNING STAGE

CROSS-REFERENCE TO RELATED APPLICATIONS

This application claims priority to DE Application No. 10 2017 209 084.7 filed May 30, 2017, the contents of which are hereby incorporated by reference in their entirety.

TECHNICAL FIELD

The present disclosure relates to planning and building design. Various embodiments may include methods and systems for improving the energy efficiency of a building at the planning stage. Furthermore, selection of suitable technical system modules for the building is facilitated.

BACKGROUND

Digitalization has already been introduced in the buildings environment. There are a plurality of different digital tools for building planning, building optimization, building management, and the like. The use of modern technology and intelligent systems enables a significant savings with respect to building design and operation. In this context, building automation is increasingly popular for improving energy efficiency and increasing comfort.

The shell of a building has always been the focus when improving energy efficiency due to the high potential for saving. Increasing importance is attached to networked and intelligent building technologies. Nowadays, most of the equipment installed in a building is used for more than just automation. Intelligent algorithms can be employed to evaluate trends and identify and predict usage and behavioral patterns with increased accuracy. As a result, it is now feasible to implement forward-looking control strategies, optimize safety measures, reduce energy consumption, and/or improve energy efficiency.

EN15232 describes two methods for estimating the energy efficiency of a building using building automation (BA) and technical building management (TBM). According to a first method, energy efficiency can be determined in a factor-based calculation. According to a second method, energy efficiency is determined by a detailed calculation which requires precise knowledge of existing or planned technical systems and automation. The second method can achieve a more accurate determination of energy efficiency.

Special tools enable room-by-room, hour-by-hour calculation and optimization of the energy and power requirements of controlled buildings for heating, ventilation, climate control, lighting, and operating facilities. The calculation procedure is aimed at the overall optimization of the energy and power requirements of such buildings. Herein, the complex relationships between usage and comfort, in the form, for example, of heating, ventilation, cooling or the like, façade design, protection from the sun, structural design, building services and building automation are depicted realistically, for example in hourly increments. This enables the energy and power demands of buildings to be determined in a simple manner. It is also possible to determine protection from heat and glare in summer and the expected thermal comfort and air quality. Finally, this enables the calculation of the static and dynamic energy demand for planned or existing building services.

SUMMARY

Existing methods for the determination and improvement of energy efficiency of buildings have the drawback that the determination of energy efficiency is always performed with reference to specific building systems or technologies. Consequently, the use of these methods requires the a priori selection of building systems or technologies. Hence, improvement of energy efficiency requires numerous calculations based on different building systems or technologies. These numerous variants require a large amount of computing effort and result in high planning costs.

The methods of the present disclosure may improve the energy efficiency of a building including the determination of the energy efficiency of the building and the selection of suitable building systems or technologies with simple means and in a cost-effective manner. For example, a method for improving the energy efficiency of a building at the planning stage may include: provision of a basic digital model of the building by means of a computing unit, definition of a plurality of different function-related room categories by means of the computing unit, assignment of existing technical building automation functions, which are stored in a storage unit coupled to the computing unit, to the different room categories by means of the computing unit, arrangement of function-related rooms in the basic digital model of the building by assigning the defined function-related room categories to the basic digital model of the building on the basis of an occupancy plan of the building by means of the computing unit, virtual coupling of the function-related rooms to supply lines of a virtual building automation system based on the assigned technical building automation functions by means of the computing unit, determination of the energy efficiency of the virtual building based on the function-related rooms coupled to the supply lines by means of the computing unit, and selection of suitable technical system modules for the building automation system from a list of available technical system modules stored in a storage unit based on the determined energy efficiency and the function-related rooms coupled to the supply lines by means of the computing unit.

In some embodiments, one or more of the function-related room categories are defined from the following list:
office,
corridor,
conference room,
kitchen,
laboratory,
toilet,
engineering room,
IT room,
store.

In some embodiments, the technical building automation functions are assigned to the different room categories in dependence on room usage times and/or degrees of room automation and/or a layout and/or an arrangement of room windows, room walls, of a room floor and/or a room ceiling.

In some embodiments, the arrangement of the function-related rooms in the basic digital model in order further to improve energy efficiency of the building is performed in dependence on a geographical alignment of the building and on the room usage times and/or of the degree of room automation.

In some embodiments, the impacts of the geographical alignment of the building, the room usage times and/or the degree of room automation on the arrangement of the function-related rooms in the building is weighted by weighting factors for improved arrangement of the rooms.

In some embodiments, the arrangement of the function-related rooms in the basic digital model in order further to improve energy efficiency of the building is such that function-related rooms with the same or similar building automation functions are preferably arranged next to one another.

In some embodiments, building automation functions from the following list are used:
heating,
cooling,
lighting,
ventilation,
glare control,
shading.

Some embodiments may include a system for improving the energy efficiency of a building at the planning stage comprising: a computing unit for the provision of a basic digital model of the building, for the definition of a plurality of different function-related room categories, for the assignment of existing technical building automation functions, which are stored in a storage unit coupled to the computing unit, to the different room categories, for the arrangement of function-related rooms in the basic digital model of the building by assigning the defined function-related room categories to the basic digital model of the building on the basis of an occupancy plan of the building, for the virtual coupling of the function-related rooms to supply lines of a virtual building automation system based on the assigned technical building automation functions, for the determination of the energy efficiency of the virtual building based on the function-related rooms coupled to the supply lines and for the selection of suitable technical system modules for the building automation system from a list of available technical system modules stored in a storage unit based on the determined energy efficiency and the function-related rooms coupled to the supply lines; a cloud for the provision of the function-related room categories and a list of technical system modules available for the automation of the building; and a digital interface for connection to a building information modeling system.

BRIEF DESCRIPTION OF THE DRAWINGS

The teachings of the present disclosure are explained below with reference to drawings, which show.

DETAILED DESCRIPTION

Figure 1:
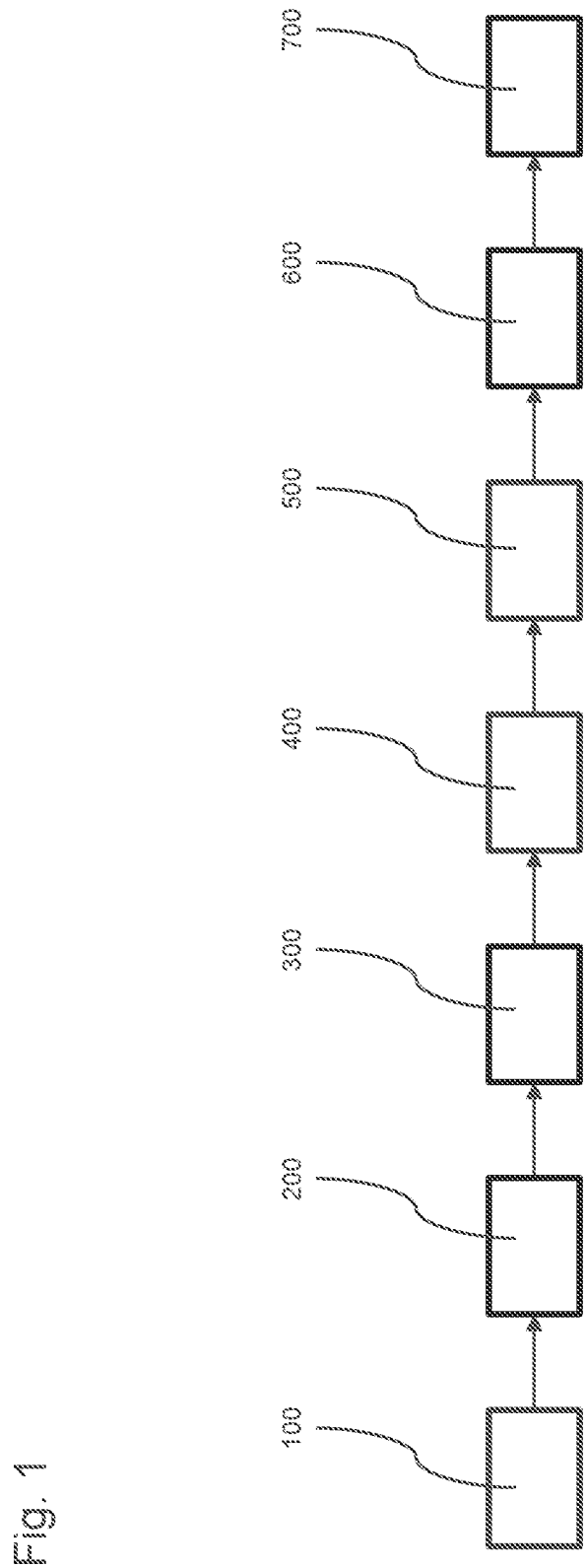
FIG. 1 a flow diagram of an embodiment of the method according to the teachings of the present disclosure.

In some embodiments, a method includes:
provision of a basic digital model of the building by means of a computing unit,
definition of a plurality of different function-related room categories by means of the computing unit,
assignment of existing technical building automation functions, which are stored in a storage unit coupled to the computing unit, to the different room categories by means of the computing unit,
arrangement of function-related rooms in the basic digital model of the building by assigning the defined function-related room categories to the basic digital model of the building on the basis of an occupancy plan of the building by means of the computing unit,
virtual coupling of the function-related rooms to supply lines of a virtual building automation system based on the assigned technical building automation functions by means of the computing unit,
determination of the energy efficiency of the virtual building based on the function-related rooms coupled to the supply lines by means of the computing unit, and
selection of suitable technical system modules for the building automation system from a list of available technical system modules stored in a storage unit based on the determined energy efficiency and the function-related rooms coupled to the supply lines by means of the computing unit.

The computing unit can, for example, comprise a PC, laptop, tablet, smartphone, or the like. The basic digital model and/or the function-related room categories and/or the assignment of the technical building automation functions and/or the arrangement of the function-related rooms in the basic digital model and/or the virtual coupling of the function-related rooms to the supply lines and/or the determination of the energy efficiency and/or the available technical system modules and/or the selection of the suitable technical system modules may be stored in a cloud and can hence be retrieved from different user locations.

The basic digital model depicts the layout and properties of the building in digital form. A digital picture of this kind is called a "digital twin". The basic digital model shows, for example, the layout and arrangement of room windows, room walls, room floors, room ceilings and the like. Properties of room windows are, for example, frame material, frame size, frame thickness, frame shape, frame cross-section and the like and type of glazing, for example double or triple glazing, pane thickness, pane material and the like. The basic digital model preferably also takes account of features such as, for example, external wall structure, material and thickness, room height, ceiling thickness and the like. The digital model depicts a desired state of the building following erection or renovation as accurately as possible. The basic digital model is provided by means of the computing unit, in particular examples in a cloud.

In some embodiments, a function-related room category defines a use or a purpose of a room. Depending on the function-related room category, the layout and requirements for building technology or room supplies and automation of rooms in different room categories may vary. Room categories may be specified as templates and stored in a cloud. Function-related room categories can also be characterized by specific usage times and different air-conditioning requirements. The different room categories may be specified by means of the computing unit.

In some embodiments, during the assignment of existing technical building automation functions to the different room categories, the types of supply required by rooms in the respective room categories are determined qualitatively. The types of supply required may include technical functions, such as, for example, heating, cooling, ventilation, illumination or solar shading or glare control. Since the different room categories each fulfil a specific purpose, different room categories can require different types of supply. Moreover, the different room categories are preferably each assigned at least one control function for the technical functions. Consequently, it can be provided that individual room categories only require some of these functions. This method step can also take account of interactions between different technical building automation functions, for example such that cooling and heating should not take place simultaneously or that the provision of solar glare control can reduce the requirement for further cooling and increase the requirement for lighting. Assignment is effected by means of the computing unit.

The arrangement of the function-related rooms in the basic digital model is based on the occupancy plan of the building. The occupancy plan can be used to determine the room categories to be assigned and/or the number and layout of rooms in the respective room category. The occupancy plan can also take account of the expected usage times of the respective rooms or room categories. The arrangement of the function-related rooms may take account of synergies between adjacent rooms in order to minimize energy loss due to heat exchange between adjacent rooms. According to this, room categories that, for example, require special cooling or heating may be arranged next to the same or similar room categories. It can also be provided that rooms in room categories with no special requirements are arranged as buffers, like a sort of insulator, between different room categories. In some embodiments, arrangement is effected by means of the computing unit.

In the case of virtual coupling, the function-related rooms may be virtually connected to supply lines of the virtual building automation system based on the assigned technical building automation functions. This, for example, connects the rooms to individual supply lines for the provision of various types of supply, such as, for example, for air, hot water, cold water, and the like. Virtual coupling may be effected by means of the computing unit.

The energy efficiency of the building can now be determined on the basis of the function-related rooms coupled to the supply lines. This energy efficiency can be determined independently of specific technical system modules for the provision of the technical building automation and the types of supply. Determination may be effected by means of the computing unit.

In some embodiments, the selection of suitable technical system modules for building automation from the list of available technical system modules stored in a storage unit is based on the determined energy efficiency and the function-related rooms coupled to the supply lines. In the case of a plurality of eligible technical system modules being available, according to the invention, the determination of the energy efficiency can, for example, be repeated one or more times, in each case with different combinations of technical system modules in order to ascertain the impacts of the selected technical system modules on energy efficiency and hence optimize selection of the technical system modules with respect to energy efficiency. Selection of the technical system modules may be effected by means of the computing unit.

Compared to known methods, a method described herein for improving the energy efficiency of a building has the advantage that reliable determination of the energy efficiency of the building can take place at the planning stage independently of technical system modules. Hence, according to the invention, the selection of suitable technical system modules is simplified since this method step is already based on the ascertained energy efficiency. Iteration loops, including repeated ascertainment of energy efficiency taking into account selected technical system modules, enables energy efficiency to be further improved with simple means. This also simplifies the selection of suitable technical system modules for the building.

In some embodiments, one or more of the function-related room categories are defined from the following list:
 office,
 corridor,
 conference room,
 kitchen,
 laboratory,
 toilet,
 engineering room,
 IT room,
 store.

A plurality of different rooms with different requirements and usages may be determined from these room categories. Here, an office can, for example, represent a room category with the highest degree of usage. Kitchens are, for example, more highly frequented at specific peak times than at off-peak times. As a rule, a laboratory typically requires a predetermined climate and is, therefore, may be arranged on a side of the building which is in particular suitable in respect of this climate. An IT room produces heat and requires cooling. Therefore, the IT room may be arranged on a north or shaded side of the building. Depending on the objects to be stored, a store can, for example, require cooling for temperature-sensitive objects or be arranged anywhere in the building in the case of temperature-robust objects. Similarly, the requirements for climate control in a toilet can be classified as relatively low. A particularly realistic determination of the energy efficiency of a building is enabled on the basis of these function-related room categories.

In some embodiments, the technical building automation functions are assigned to the different room categories in dependence on room usage times and/or degrees of room automation and/or a layout and/or an arrangement of room windows, room walls, a room floor, and/or a room ceiling. Room usage times are times during which a room can be expected to be used. An office will have correspondingly long room usage times while a conference room tends to have a shorter usage time window, wherein the regular use of the conference room starts later and stops earlier. A toilet has even shorter room usage times. Hence, for example, more importance should be attached to climate control in an office than to the climate control in a toilet. Climate control, in particular cooling, in a conference room can therefore be started later and finished earlier than climate control or cooling in an office. Furthermore, it is, for example, possible to reduce the power consumption of the toilet by intelligent light control. A kitchen is used most often during rest breaks. A laboratory may, for example, be subject to particular requirements relating to a defined room climate, for example for precise control of air temperature, atmospheric humidity and the like.

In some embodiments, the degrees of room automation may be dependent on the function-related room categories. Accordingly, an office or a conference room preferably has a higher degree of room automation than a corridor, a kitchen, or a toilet. The location and layout of windows, ceilings, floors, and walls can have a direct impact on the technical building automation functions. For example, sunblinds have less effect in the case of relatively small building windows than they do in the case of relatively large building windows. The air volume to be replaced is greater with a relatively large room height than it is with a relatively low room height. Wall thicknesses or strengths have a direct impact on the thermal insulation of the rooms or the building.

In some embodiments, the arrangement of the function-related rooms in the basic digital model to improve energy efficiency of the building is based on the geographical alignment of the building and the room usage times and/or the degree of room automation. It is furthermore possible to take account of the geographical location of the building—in particular with reference to the respective climatic zone.

Rooms with a higher cooling requirement or lower light requirement can, for example, be arranged on a north side of the building. Rooms with a high degree of usage in the afternoon can, for example, be arranged on a south-west side of the building.

In some embodiments, the impacts of the geographical alignment of the building, the room usage times, and/or the degree of room automation on the arrangement of the function-related rooms in the building may be weighted by means of weighting factors. These weighting factors can be used to ascertain the impacts of individual features, such as, for example, geographical arrangement in the building, room usage times and degree of room automation, on a function-related room. Taking this weighting into account, the rooms may be arranged in the building in the most energy-efficient manner possible. Weighting may be even more useful if the individual features have opposing impacts on the room. For example, the need for glare control is lower in the case of an arrangement on a north side of the building than it is on the south side. The need for glare control is directly related to the need to cool the room. The need for lighting is in turn also dependent upon the need for glare control. Hence, weighting of the individual features enables the arrangement of the rooms to be optimized from the viewpoint of further improving the energy efficiency of the rooms.

In some embodiments, the arrangement of the function-related rooms includes function-related rooms with the same or similar building automation functions may be arranged next to one another. This measure in particular takes account of interaction between adjacent rooms. In this way, for example, for rooms with a high cooling requirement can be arranged directly next to one another in order to minimize heat exchange between these rooms. Alternatively, a room with a moderate heating or cooling requirement can be arranged between a room with a high cooling requirement and a room with high heating requirement in order at least to curtail heat transfer between the rooms. If a room with high cooling requirement were arranged directly next to a room with high heating requirement, heat flows between the rooms could result in high energy losses that would have to be compensated with an additional supply of cold or heat to the rooms. Energy losses can consequently be reduced. This also has the advantage that it is possible to reduce the overall length of the supply lines in the building.

In some embodiments, building automation functions may include one or more of:
 heating,
 cooling,
 lighting,
 ventilation,
 glare control,
 shading.

The heating and cooling can have one or more central units, which are arranged, for example, in a service room of the building, or decentralized units, which are arranged, for example, in the respective rooms. In some embodiments, a power supply is provided for the lighting. The ventilation may be provided by means of a central ventilation unit. In some embodiments, the central ventilation unit can take over additional building automation functions, in particular heating and/or cooling. Glare control may be provided by suitable blinds, which are manually and/or electrically adjustable. In some embodiments, glare control and/or shading is effected automatically by means of a central control unit, which regulates the glare control or shading depending on the time of day and/or the time of year and/or the intensity of the sun. The central control unit may regulate the lighting in the rooms depending on the prevailing light intensity.

In some embodiments, there is a system for improving the energy efficiency of a building at the planning stage. An example system may include a computing unit for the provision of a basic digital model of the building, for the definition of a plurality of different function-related room categories, for the assignment of existing technical building automation functions, which are stored in a storage unit coupled to the computing unit, to the different room categories, for the arrangement of function-related rooms in the basic digital model of the building by assigning the defined function-related room categories to the basic digital model of the building on the basis of an occupancy plan of the building, for the virtual coupling of the function-related rooms to supply lines of a virtual building automation system based on the assigned technical building automation functions, for the determination of the energy efficiency of the virtual building based on the function-related rooms coupled to the supply lines and for the selection of suitable technical system modules for the building automation from a list of available technical system modules stored in a storage unit based on the determined energy efficiency and the function-related rooms coupled to the supply lines.

In some embodiments, the system also comprises a cloud for the provision of the function-related room categories and a list of technical system modules available for the automation of the building and a digital interface for connection to a building information modeling system. The system described herein may provide the same advantages as those described above for the method.

Accordingly, compared to known systems, the system described herein for improving the energy efficiency of a building may provide a reliable determination of the energy efficiency of the building at the planning stage performed independently of technical system modules. Hence, the selection of suitable technical system modules is simplified since the energy efficiency determined is already based on this method step. The selection of suitable technical system modules for the building is also simplified.

In FIG. 1 is a schematic depiction of an example method according to the present disclosure in a flow diagram. In a first method step 100, a basic digital model of a building is provided by means of a computing unit. The basic digital model may include walls, windows, doors, ceilings, and floors. Rooms or room areas present in the basic digital model are may be at least substantially functionally neutral.

In a second method step 200, the computing unit establishes a plurality of different function-related room categories. The function-related room categories can, for example, include an office, a corridor, a conference room, a kitchen, a laboratory, a toilet, an engineering room, or the like.

In a third method step 300, the computing unit reads existing technical building automation functions out of a storage unit and assigns them to the different room categories. Technical building automation functions may include, for example, heating, cooling, lighting, ventilation, glare control or the like.

In a fourth method step 400, function-related rooms are arranged in the building. This arranging is effected by means of the computing unit by assigning the defined function-related room categories to the basic digital model of the building on the basis of an occupancy plan of the building. The occupancy plan may take account of room usage times and/or degrees of room automation and/or a layout and/or an arrangement of room windows, room walls, of a room floor and/or a room ceiling.

In a fifth method step 500, the function-related rooms are virtually coupled to supply lines of a virtual building automation system based on the assigned technical building automation functions by means of the computing unit.

In a sixth method step 600, the energy efficiency of the building based on the function-related rooms coupled to the supply lines is determined by means of the computing unit.

In a seventh method step 700, the computing unit selects technical system modules for the building automation system from a list of available technical system modules stored in a storage unit. The selection is based on the determined energy efficiency and the function-related rooms coupled to the supply lines.

Figure 2:
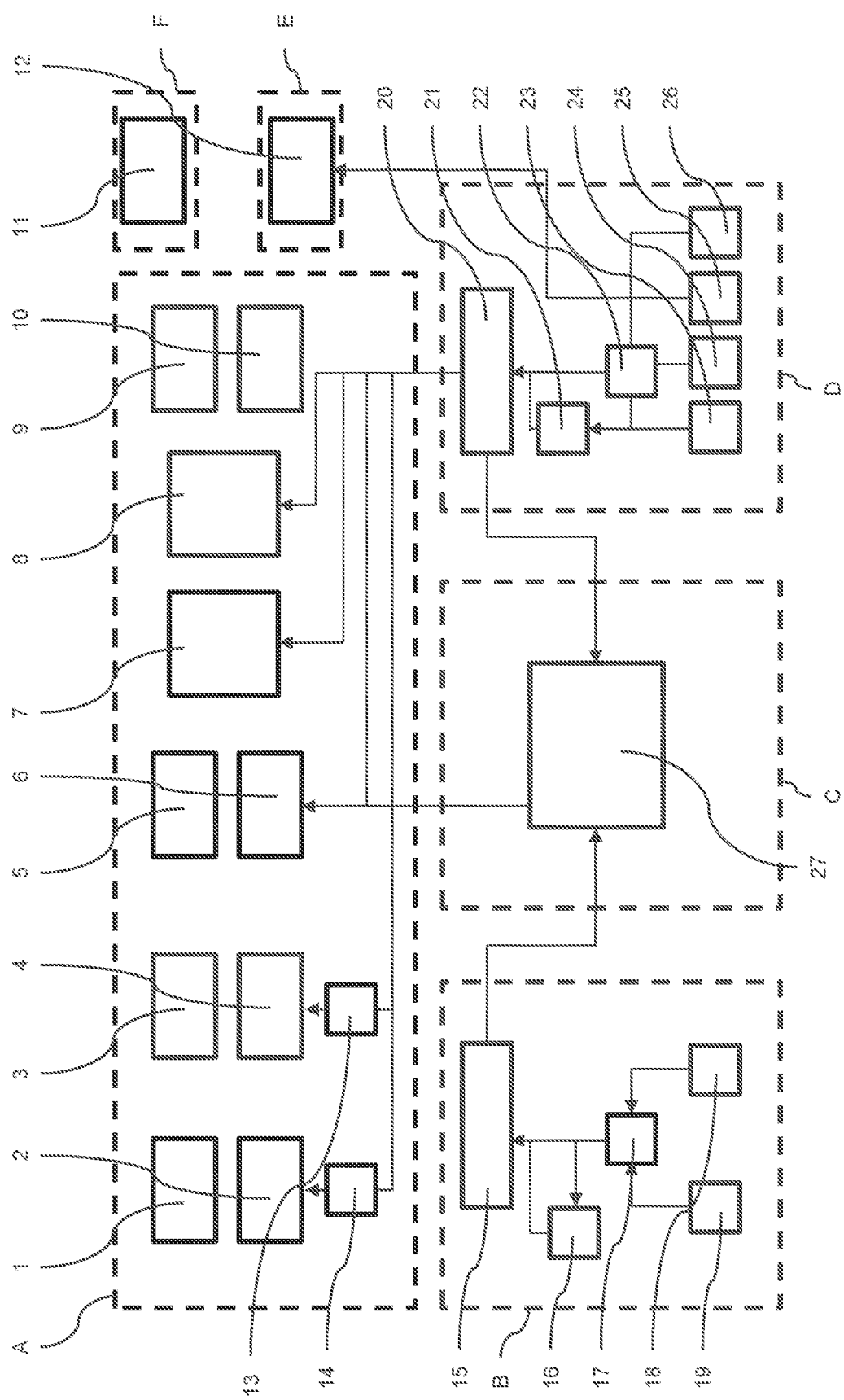
FIG. 2 the interconnection of technical building automation functions of a building according to teachings of the present disclosure.

FIG. 2 is a schematic depiction of a building automation system. The building automation system may comprise a plurality of interconnected technical building automation functions of a building.

A room A contains a cooling system 2 with a TABS cold transfer control system 1 and a cold transfer and/or distribution control system for intermittent operation 14. The TABS cold transfer control system 1 is a transfer control system for technical building management F for heating operation. Technical building management F is also known by the term "TABS". Room. A also contains a heating system 4 with a TABS heat transfer control system 3 and a heat transfer and/or distribution control system for intermittent operation 13. The TABS heat transfer control system 3 is a transfer control system for technical building management F for cooling operation.

To control the room climate, room A also contains a variable air volume system 5, a constant volume system 6, a recirculated air fan convector 7, a fresh air fan convector 8, a blind 9 for glare control against sunlight and a lighting device 10. The room A is connected to a technical building management F with a building automation and control system 11 and a hot water system E with a domestic hot water system 12.

For the provision of the operational equipment, the building automation system comprises a cooling system B, a ventilation system C with a ventilation plant 27 and a heating system D. The cooling system B comprises a cooling device 19 and district cooling 18 or a connection to a district cooling system. It can be provided in the scope of the invention that only one of these components is present in each case. The provision of cooling is controlled via a cooler operational sequence 17. The cooling system B comprises an optional cold store 16 for storing cold and a cold distributor 15 for distributing cold in the building. The heating system D comprises a heating boiler 23, district heating 24, a heat pump 25 and an outdoor unit 26 for controlling a heat generator. It can be provided in the scope of the invention that only one of these components is present in each case. The provision of heat is controlled via a heat generator operational sequence 22. The heating system D furthermore comprises a heat store 21 for storing heat and a heat distributor 20 for distributing heat in the building.

LIST OF REFERENCE CHARACTERS

1 TABS cold transfer control system
2 Cooling
3 TABS heat transfer control system
4 Heating
5 Variable air volume system
6 Constant volume system
7 Recirculated air fan convector
8 Fresh air fan convector
9 Blind
10 Lighting device
11 Building automation and control system
12 Domestic hot water system
13 Heat transfer and/or distribution control system for intermittent operation
14 Cold transfer and/or distribution control system for intermittent operation
15 Cold distributor
16 Cold store
17 Cooler operational sequence
18 District cooling
19 Cooling device
20 Heat distributor
21 Heat store
22 Heat generator operational sequence
23 Heating boiler
24 District heating
25 Heat pump
26 Outdoor unit
27 Ventilation plant
A Room
B Cooling system
C Ventilation system
D Heating system
E Hot water system
F Technical building management
100 First method step
200 Second method step
300 Third method step
400 Fourth method step
500 Fifth method step
600 Sixth method step
700 Seventh method step

The invention claimed is:

1. A method for improving the energy efficiency of a building at the planning stage, the method including:
building a basic digital model of the building using a computer;
defining a plurality of different function-related room categories;
assigning existing technical building automation functions, previously stored in a memory coupled to the computer, to the different room categories based on at least one factor selected from the group consisting of: room usage time, degrees of room automation, a layout, and an arrangement of room windows, room walls, a room floor, and/or a room ceiling;
arranging function-related rooms in the basic digital model by assigning the defined function-related room categories to the basic digital model of the building on the basis of an occupancy plan of the building, the occupancy plan including at least one factor selected from the group consisting of: room usage times, degrees of room automation, a layout, and an arrangement of room windows, room walls, a room floor, and/or a room ceiling;
coupling the function-related rooms to supply lines of an automation system for a virtual building using the assigned technical building automation functions;
determining an energy efficiency of the virtual building based on coupled function-related rooms and supply lines; and
selecting suitable technical system modules for the building automation system from a list of available technical system modules stored in the memory based on the determined energy efficiency and the function-related rooms coupled to the supply lines including accounting for synergies between adjacent function-related rooms to minimize energy loss based on heat exchange between adjacent rooms.

2. The method as claimed in claim 1, wherein the function-related room categories one or more of the following: an office, a corridor, a conference room, a kitchen, a laboratory, a toilet, an engineering room, an IT room, and a store.

3. The method as claimed in claim 1, wherein the technical building automation functions are assigned to the different room categories in dependence on at least one of: room usage times, degrees of room automation, a layout, or an arrangement of room windows, room walls, a room floor and/or a room ceiling.

4. The method as claimed in claim 3, wherein the arrangement of the function-related rooms in the basic digital model depends on a geographical alignment of the building and on room usage times and/or degree of room automation.

5. The method as claimed in claim 4, wherein impacts of the geographical alignment of the building, the room usage times, and/or the degree of room automation on the arrangement of the function-related rooms in the building is weighted by weighting factors for improved arrangement of the rooms.

6. The method as claimed in claim 1, wherein the arrangement of the function-related rooms in the basic digital model provides that function-related rooms with the same or similar building automation functions are arranged next to one another.

7. The method as claimed in claim 1, wherein building automation functions include one or more of the following: heating, cooling, lighting, ventilation, glare control, and shading.

8. A system for improving the energy efficiency of a building at the planning stage, the system comprising:
   a computer providing access to a basic digital model of the building;
   wherein the basic digital model includes a plurality of different function-related room categories;
   a memory coupled to the computer storing a list of existing technical building automation functions assigned to the plurality of room categories based on at least one factor selected from the group consisting of: room usage time, degrees of room automation, a layout, and an arrangement of room windows, room walls, a room floor, and/or a room ceiling,
   wherein the computer allows a user request a combination of the different room categories;
   wherein the computer automatically arranges function-related rooms in the basic digital model of the building by assigning the defined function-related room categories to the basic digital model of the building on the basis of an occupancy plan of the building, the occupancy plan including at least one factor selected from the group consisting of: room usage times, degrees of room automation, a layout, and an arrangement of room windows, room walls, a room floor, and/or a room ceiling;
   wherein the computer couples the function-related rooms to supply lines of an automation system for a virtual building using the assigned technical building automation functions;
   wherein the computer determines an energy efficiency of the virtual building based on the function-related rooms coupled to the supply lines;
   wherein the computer selects suitable technical system modules for the building automation system from a list of available technical system modules stored in a storage unit based on the determined energy efficiency and the function-related rooms coupled to the supply lines including accounting for synergies between adjacent function-related rooms to minimize energy loss based on heat exchange between adjacent rooms;
   a cloud for the provision of the function-related room categories and a list of technical system modules available for the automation of the building; and
   a digital interface for connection to a building information modeling system.

* * * * *